US010163954B2

(12) United States Patent
Su et al.

(10) Patent No.: US 10,163,954 B2
(45) Date of Patent: Dec. 25, 2018

(54) TRENCHED DEVICE WAFER, STEPPED-SIDEWALL DEVICE DIE, AND ASSOCIATED METHOD

(71) Applicant: OmniVision Technologies, Inc., Santa Clara, CA (US)

(72) Inventors: Yumei Su, Taipei (TW); Chi-Chih Huang, Hsinchu (TW); Wei-Feng Lin, Hsinchu (TW)

(73) Assignee: OmniVision Technologies, Inc., Santa Clara, CA (US)

( * ) Notice: Subject to any disclaimer, the term of this patent is extended or adjusted under 35 U.S.C. 154(b) by 3 days.

(21) Appl. No.: 15/096,136

(22) Filed: Apr. 11, 2016

(65) Prior Publication Data

US 2017/0294471 A1    Oct. 12, 2017

(51) Int. Cl.
*H01L 27/146*   (2006.01)
*H01L 21/78*    (2006.01)
*H01L 21/86*    (2006.01)

(52) U.S. Cl.
CPC .. *H01L 27/14632* (2013.01); *H01L 27/14687* (2013.01)

(58) Field of Classification Search
CPC ....... H01L 2924/00014; H01L 2924/00; H01L 21/78; H01L 2224/131; H01L 2224/94
USPC ........ 257/527, 594, 618, 620, 622, E21.596, 257/E21.599; 438/33, 68, 107, 113, 459, 438/460–465, 977–978, 114, 458
See application file for complete search history.

(56) References Cited

U.S. PATENT DOCUMENTS

| 6,723,952 B2 | 4/2004 | Choo et al. | |
|---|---|---|---|
| 7,759,779 B2 * | 7/2010 | Okada | H01L 24/97 257/678 |
| 8,883,614 B1 * | 11/2014 | Lei | H01L 21/78 438/460 |
| 2003/0230805 A1 * | 12/2003 | Noma | H01L 23/3114 257/737 |
| 2005/0208735 A1 * | 9/2005 | Noma | H01L 21/561 438/460 |
| 2006/0214266 A1 | 9/2006 | Jordan | |
| 2008/0035617 A1 | 2/2008 | Fu et al. | |
| 2010/0243627 A1 | 9/2010 | Lee et al. | |

(Continued)

OTHER PUBLICATIONS

Shi et al.; Characterization of Laser Micromachining Process for Low-k / Ultra Low-k Semiconductor Device; Australian Journal of Basic and Applied Sciences; Oct. 25, 2014; AENSI Journals; 7 pages.

*Primary Examiner* — Jonathan Han
(74) *Attorney, Agent, or Firm* — Lathrop Gage LLP

(57) ABSTRACT

A trenched device wafer includes a device substrate layer having a top surface; a plurality of devices in the device substrate layer, and a trench in the top surface. The trench extends into the device substrate layer, and is located between a pair of adjacent devices of the plurality of devices. A method for forming a device die from a device wafer includes forming a trench in a top surface of the device wafer between two adjacent devices of the device wafer. The trench has a bottom surface located (a) at a first depth beneath the top surface and (b) at a first height above a wafer bottom surface. The method also includes, after forming the trench, decreasing a thickness of the device wafer, between the two adjacent devices, to a thickness less than the first height.

12 Claims, 8 Drawing Sheets

(56) References Cited

U.S. PATENT DOCUMENTS

2012/0175722 A1 7/2012 Tai et al.
2014/0346669 A1* 11/2014 Wang .................. H01L 24/13
　　　　　　　　　　　　　　　　　　　　257/737

* cited by examiner

TRENCHED DEVICE WAFER, STEPPED-SIDEWALL DEVICE DIE, AND ASSOCIATED METHOD

BACKGROUND

Wafer-level manufacturing of camera modules manufactured with complementary metal-oxide semiconductor (CMOS) technologies has contributed to the incorporation of camera modules in high-volume consumer products such as mobile devices and motor vehicles. FIG. 1 is a perspective view of a device wafer 100 having a plurality of devices 102 thereon. Devices 102 are for example CMOS image sensors used in the aforementioned camera modules. FIG. 1 includes a plurality of scribe lines 190 between adjacent rows and columns of devices 102. Dicing device wafer 100 along scribe lines 190, by laser grooving for example, results in a plurality of singulated devices 102.

FIG. 2 is a cross-sectional view of device wafer 100 along cross-section A-A' of FIG. 1 after a groove 250 is formed along a scribe line 190. Cross-section A-A' intersects a plurality of devices 102 including devices 102(1) and 102 (2). Device wafer 100 includes dielectric layers 206(0-4), a device substrate layer 220, a bond pad 210, and a top surface 100T. Device substrate layer 220 is, for example, a semiconductor, such as silicon. Dielectric layers 206 include conductive traces 207, which for clarity of illustration are not all labelled. Conductive traces 207 within a seal-ring region 207R(1) are electrically connected with device 102 (1). Conductive traces 207 within a seal-ring region 207R(2) are electrically connected with device 102(2).

FIG. 2 also illustrates debris 213 that results from the laser grooving process that forms groove 250. Debris 213 has a height 213H that is typically less than two micrometers. A plurality of device dies 100D is obtained by dicing wafer 100 through carrier 201 beneath groove 250. A vacuum nozzle 280 is used to pick and place each device die 100D. Vacuum nozzle 280 may touch debris 213 during the pick-and-place process, which can results in debris 213 damaging one or more of vacuum nozzle 280, top surface 100T, and device 102.

SUMMARY OF THE INVENTION

In one embodiment, a trenched device wafer is disclosed. The trenched device wafer includes a device substrate layer having a top surface; a plurality of devices in the device substrate layer, and a trench in the top surface. The trench extends into the device substrate layer, and is located between a pair of adjacent devices of the plurality of devices.

In another embodiment, a stepped-sidewall device die is disclosed. The stepped-sidewall device die includes a device substrate layer, a layer portion, and a device formed on the device substrate layer. The device substrate layer has a top surface having a top width. The layer portion has a width at a distance beneath the top surface, the width exceeding the top width.

In another embodiment, a method for forming a device die from a device wafer is disclosed. The method includes forming a trench in a top surface of the device wafer between two adjacent devices of the device wafer. The trench has a bottom surface located (a) at a first depth beneath the top surface and (b) at a first height above a wafer bottom surface. The method also includes, after forming the trench, decreasing a thickness of the device wafer, between the two adjacent devices, to a thickness less than the first height.

DETAILED DESCRIPTION OF THE EMBODIMENTS

Figure 1:
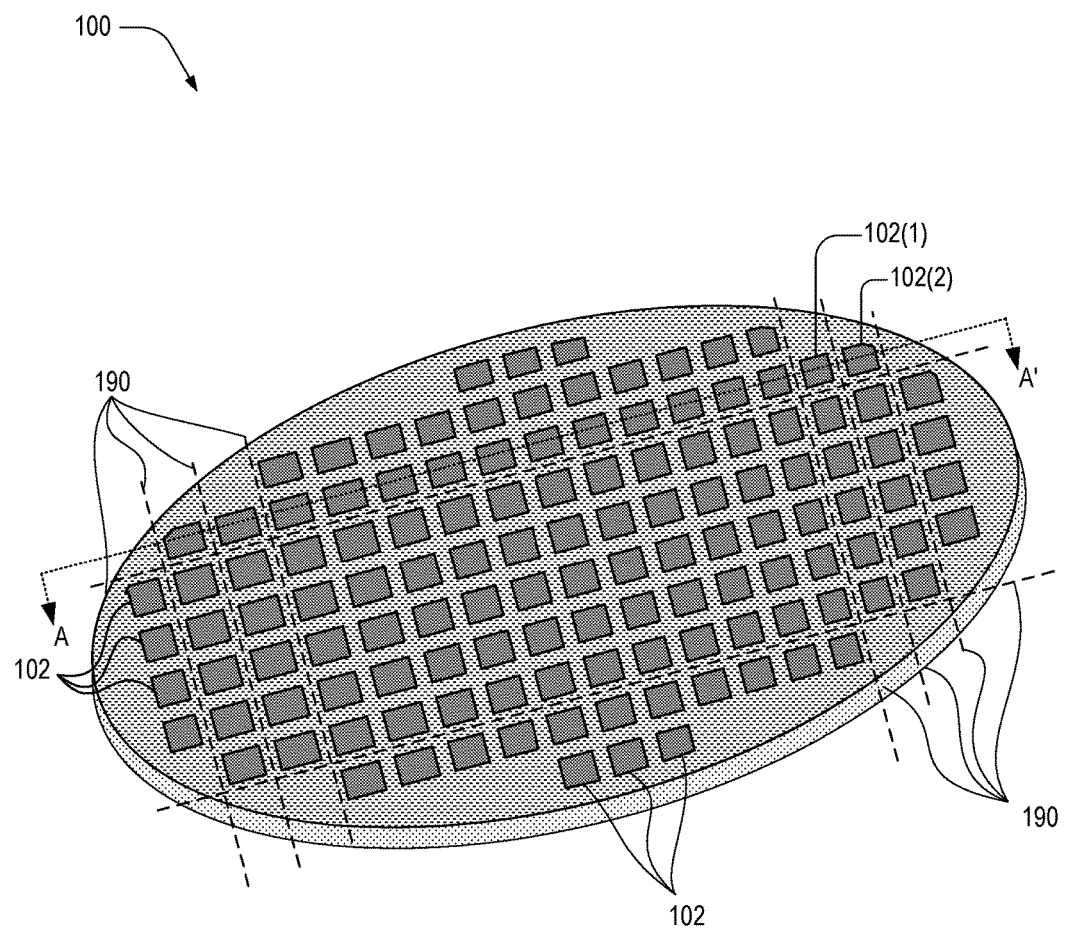
FIG. 1 is a perspective view of a device wafer having a plurality of devices thereon.
Figure 2:
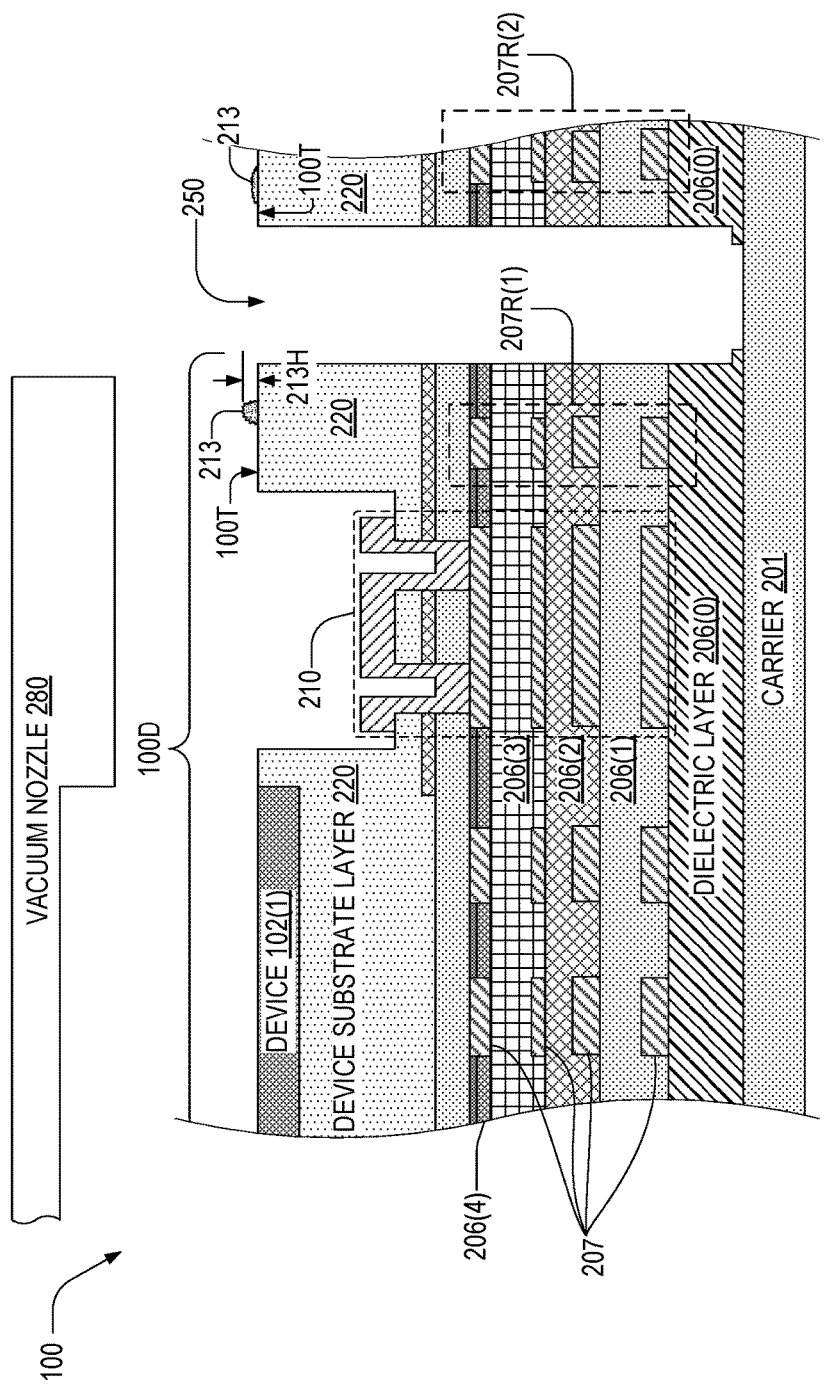
FIG. 2 is a cross-sectional view of the device wafer of FIG. 1.
Figure 3:
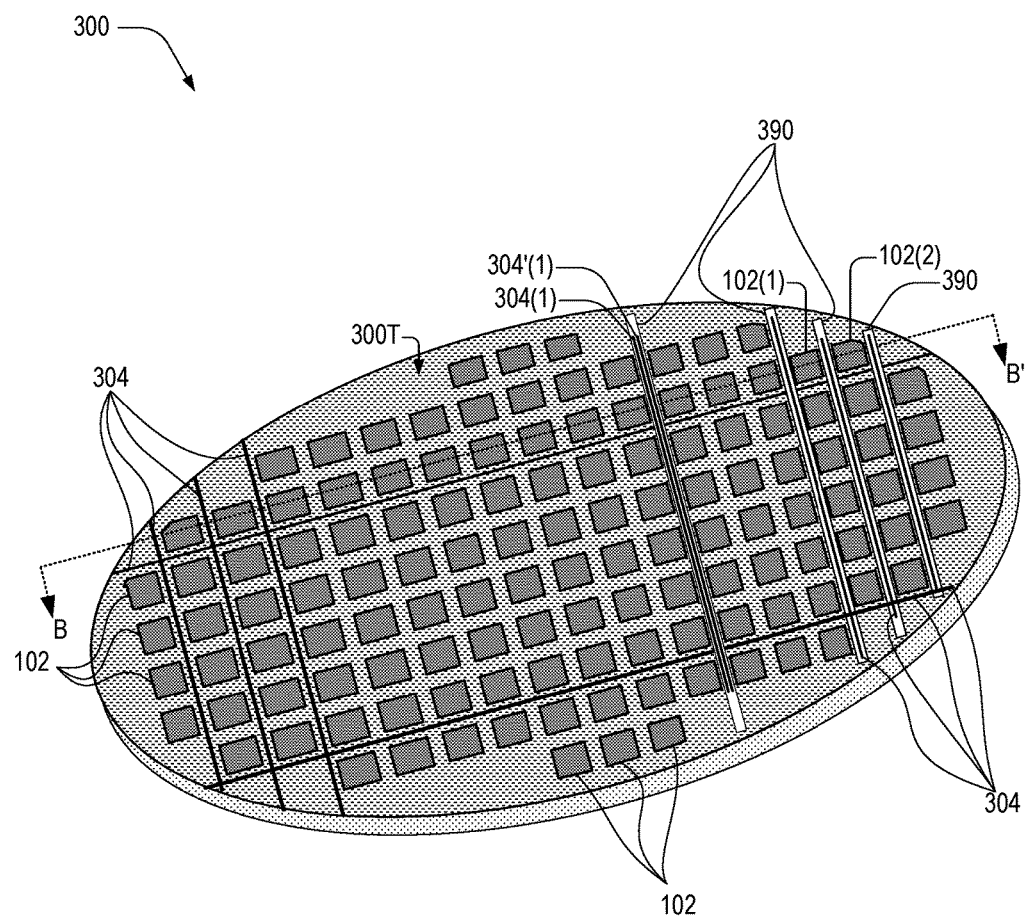
FIG. 3 is a perspective view of a trenched device wafer having a plurality of devices of FIG. 1 thereon and trenches therebetween, in an embodiment.

FIG. 3 is a perspective view of a trenched device wafer 300 having a plurality of devices 102 thereon and trenches 304 therebetween. A pair of adjacent devices may have more than one trench therebetween, such as trenches 304(1) and 304'(1). Trenched device wafer 300 has a top surface 300T and a plurality of scribe lines (a.k.a. "saw streets") 390 through which a respective trench 304 is formed.

Figure 4:
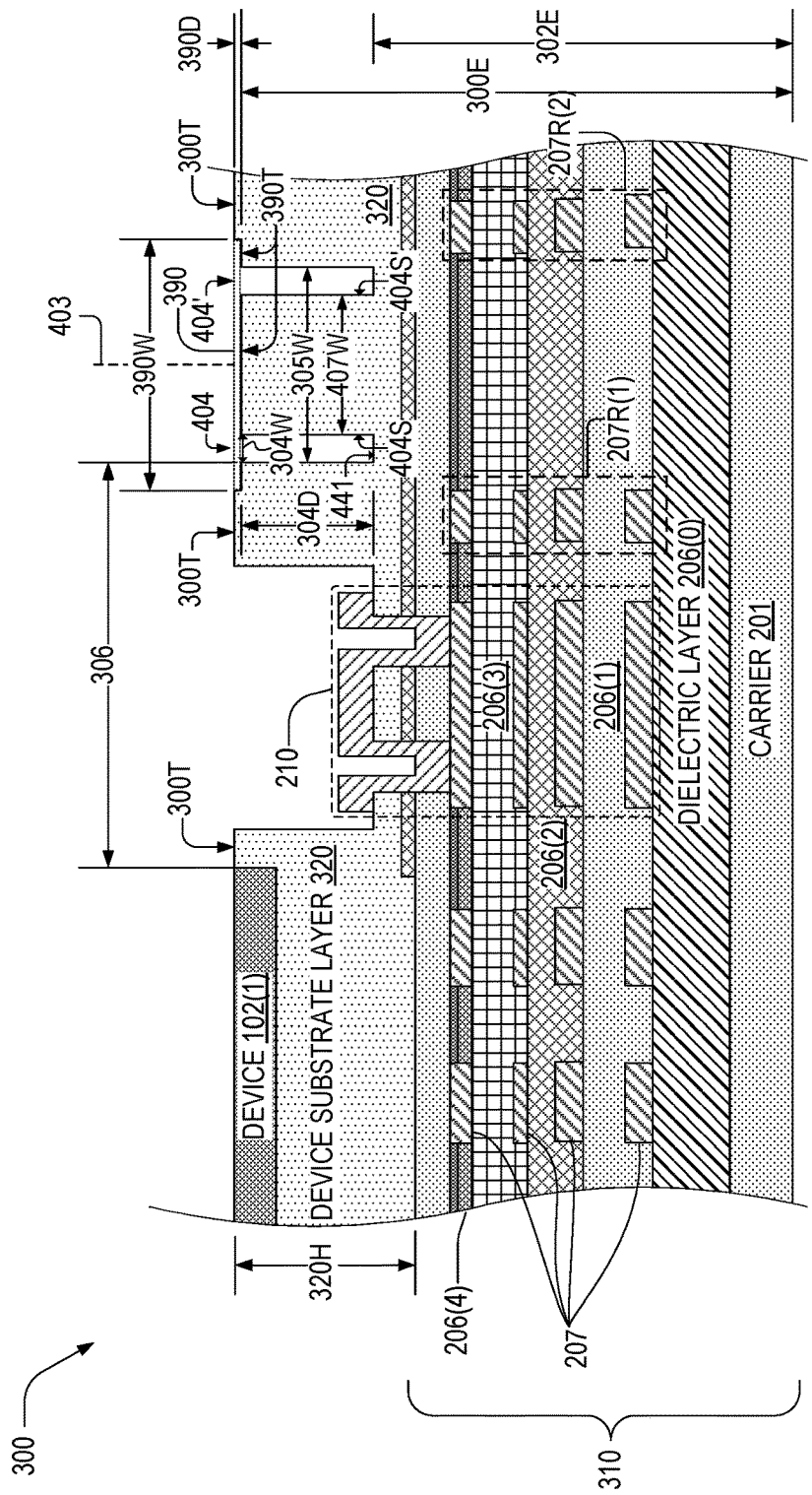
FIG. 4 is a cross-sectional view of the device wafer of FIG. 3, in an embodiment.
Figure 5A:
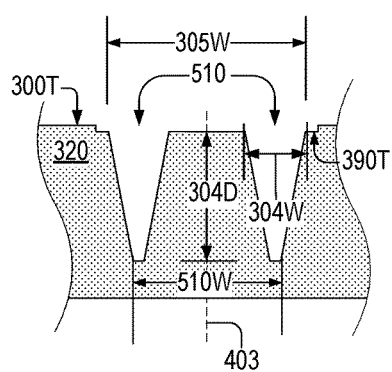
FIGS. 5A-5D are cross-sectional views of exemplary trenches in the trenched-device wafer of FIG. 3.
Figure 5B:
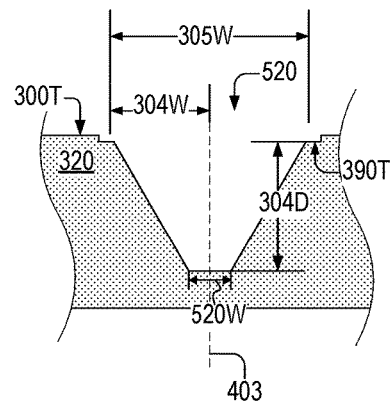
Figure 5C:
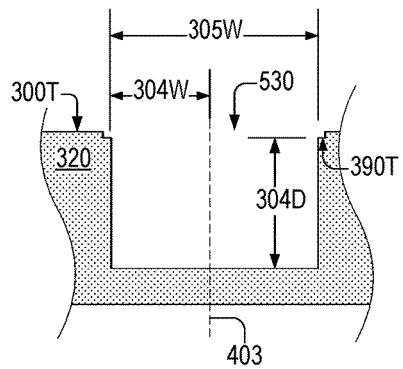
Figure 5D:
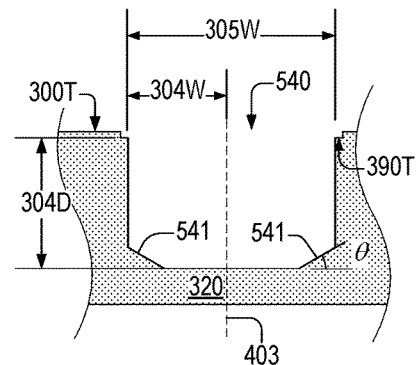

FIG. 4 is a cross-sectional view of trenched device wafer 300 along cross-section B-B' of FIG. 3 with trenches 404 and 404' therein. Trenches 404 and 404' are examples of trenches 304(1) and 304'(1), and are through a same scribe line 390. Scribe lines 390 form an indented region of top surface 300T, which includes a top surface 390T of scribe-line 390. Scribe line 390 has a scribe-line width 390W, which is for example between 50 μm and 130 μm, and a scribe-line depth 390D, which is for example between 2 μm and 3 μm. Without departing from the scope hereof, trenched device wafer 300 may lack scribe lines 390, or have scribe-lines 390 with zero depth, such that depth 390D equals zero.

Like device wafer 100, trenched device wafer 300 includes dielectric layers 206(0-4), bond pad 210, and device 102. Device 102 is within a device substrate layer 320, which is similar to device substrate layer 220, except for trenches 404 and 404' therein.

Trench 404 is located a distance 306 from device 102(1). Distance 306 is for example between 200 μm and 300 μm. Distance 306 is for example greater than a minimum distance 100 μm to provide sufficient space for bond pad 210 and surface area of top surface 300T for vacuum nozzle 280 to sort dies singulated from trenched device wafer 300. Trench 404 has a width 304W, which is for example greater than 10 μm to allow debris 213 to collect on a trench landing 441. Trenches 404 and 404' may be equidistant from a midplane 403 located halfway between devices 102(1) and 102(2).

Trenches 404 and 404' have respective trench sidewalls 404S and 404S' that are separated by a distance 407W. Trenches 404 and 404' may deviate from perfect parallelism such that distance 407W varies along top surface 300T. In an embodiment, distance 407W equals zero at a location such that that in a cross-section, trenches 404 and 404' merge to form a single trench with width 305W.

Trench 404 has a depth 304D from top surface 300T, which corresponds to scribe-line top surface 390T when wafer 300 includes scribe line 390. At scribe line 390, trenched device wafer 300 has a thickness 300E such that between devices 102(1) and 102(2), trenched device wafer 300 has an inter-device thickness 302E that equals depth 304D subtracted from thickness 300E. Depth 304D is for example 2.0±0.5 µm, which is sufficiently deep to prevent debris 213 from collecting on top surface 300T. Trench 404 may extend into layers of wafer 300 beneath device substrate layer 320.

Whereas trench 404 has rectangular cross-section in FIG. 4, trench 304 may be differently shaped without departing from the scope hereof. For example, FIGS. 5A-5D are cross-sectional views of device substrate layer 320 with trenches 510, 520, 530, and 540 therein, respectively. Trenches 510, 520, 530, and 540 are each examples of trench 304. Trenches 520, 530, and 540 and are centered about midplane 403 and span a width 305W shown in FIG. 4. Trench 540 includes landings 541 that form an angle θ with a plane parallel to top surface 300T such that, in more general case when |θ|>0°, landings 541 are not parallel to top surface 300T. Any of trenches 510, 520, 530, and 540 may extend into a layer beneath device substrate layer 320. In an embodiment, a trench 510-540 is through a scribe line 390 and, to prevent damage to device components, has a width 305W less than scribe-line width 390W. A potential advantage of two narrow trenches 510 compared to a single wide trench (520, 530, and 540) is that the space between trenches 510 may correspond to a test site during wafer acceptance testing.

Device wafer may have more or fewer layers than shown in FIG. 4, such as fewer or more than four dielectric layers 206, without departing from the scope hereof. Layers beneath device substrate layer 320 are part of compound layer 310. These include dielectric layers 206 and carrier 201.

Figure 6:
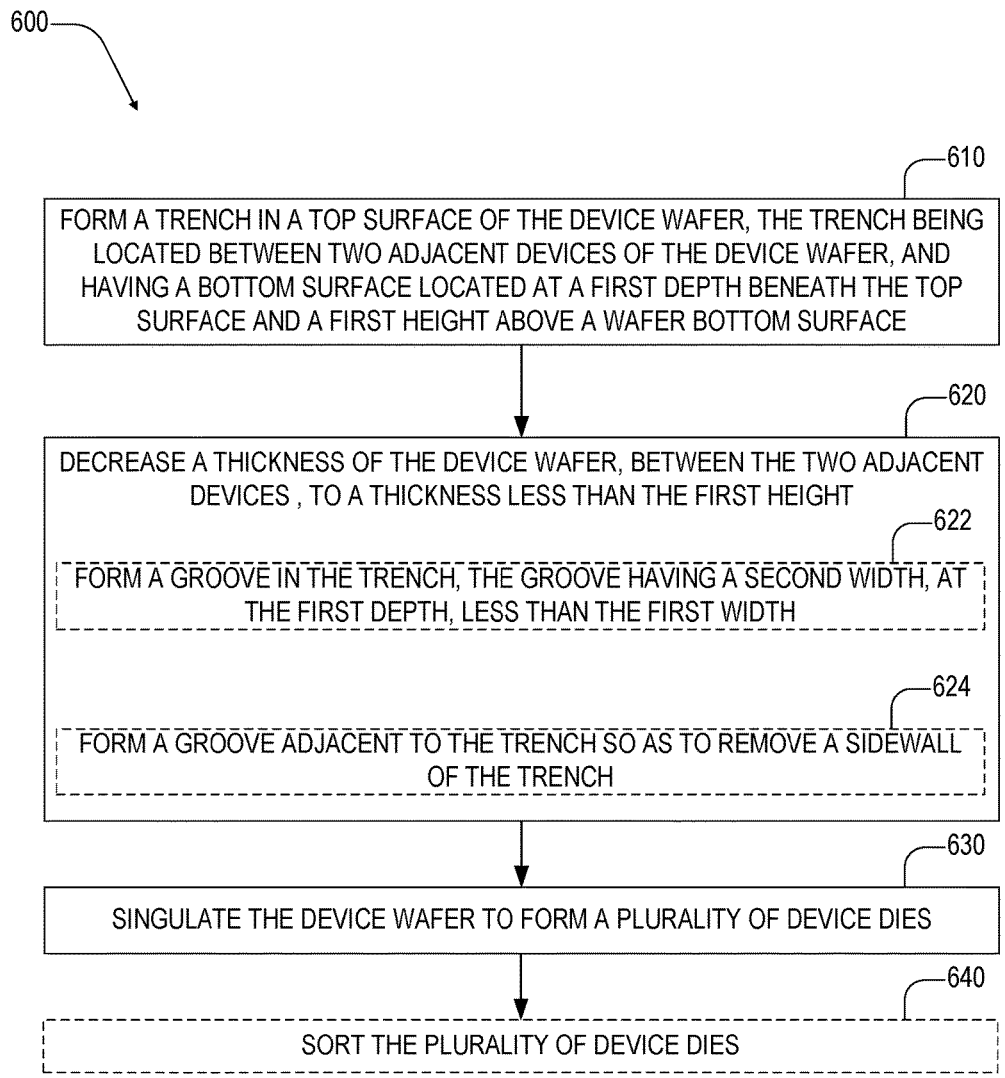
FIG. 6 is a flowchart illustrating an exemplary method for forming a device die from a device wafer, in an embodiment.
Figure 7:
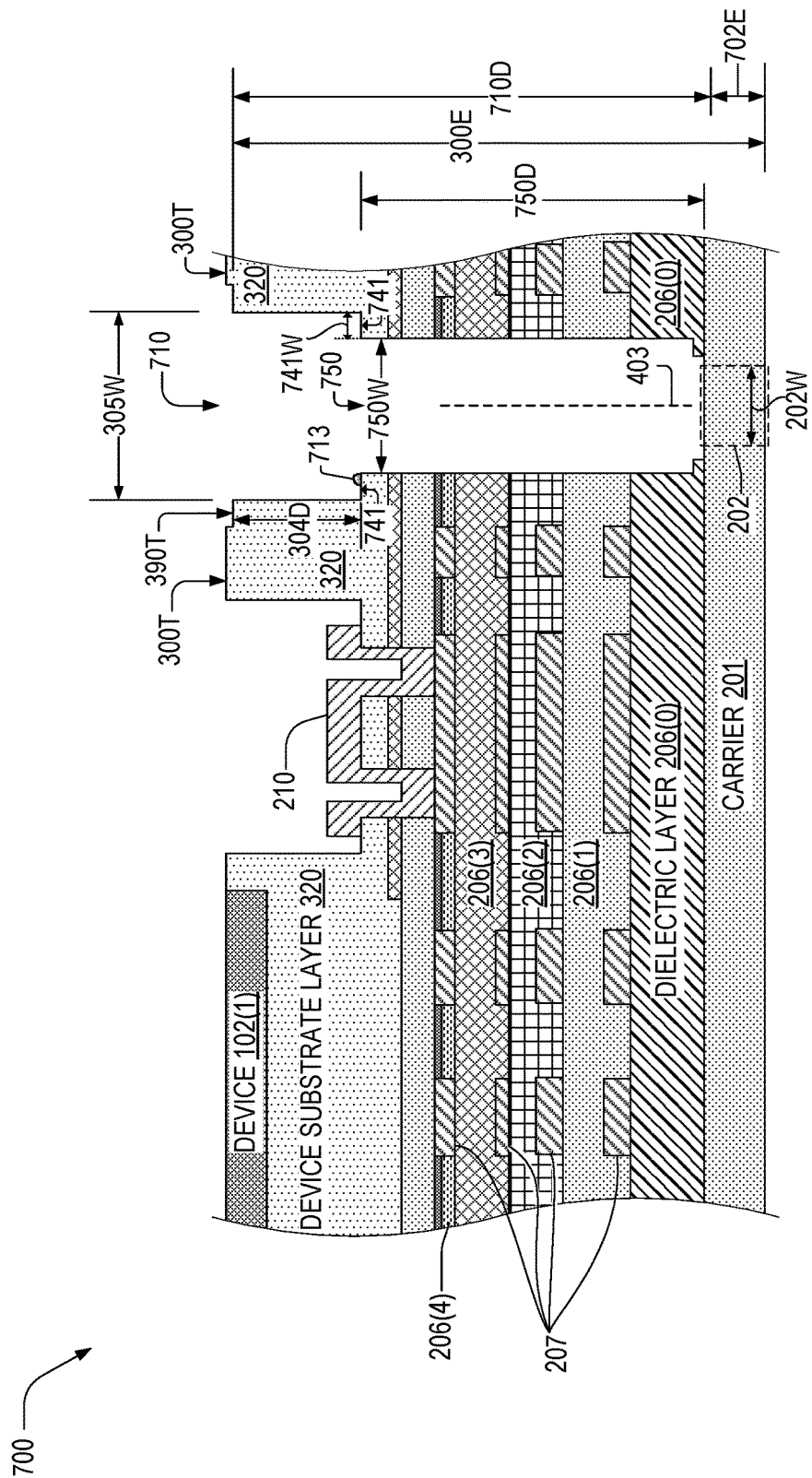
FIG. 7 is a cross-sectional view of a grooved device wafer resulting from a step of the method of FIG. 6, in an embodiment.
Figure 8:
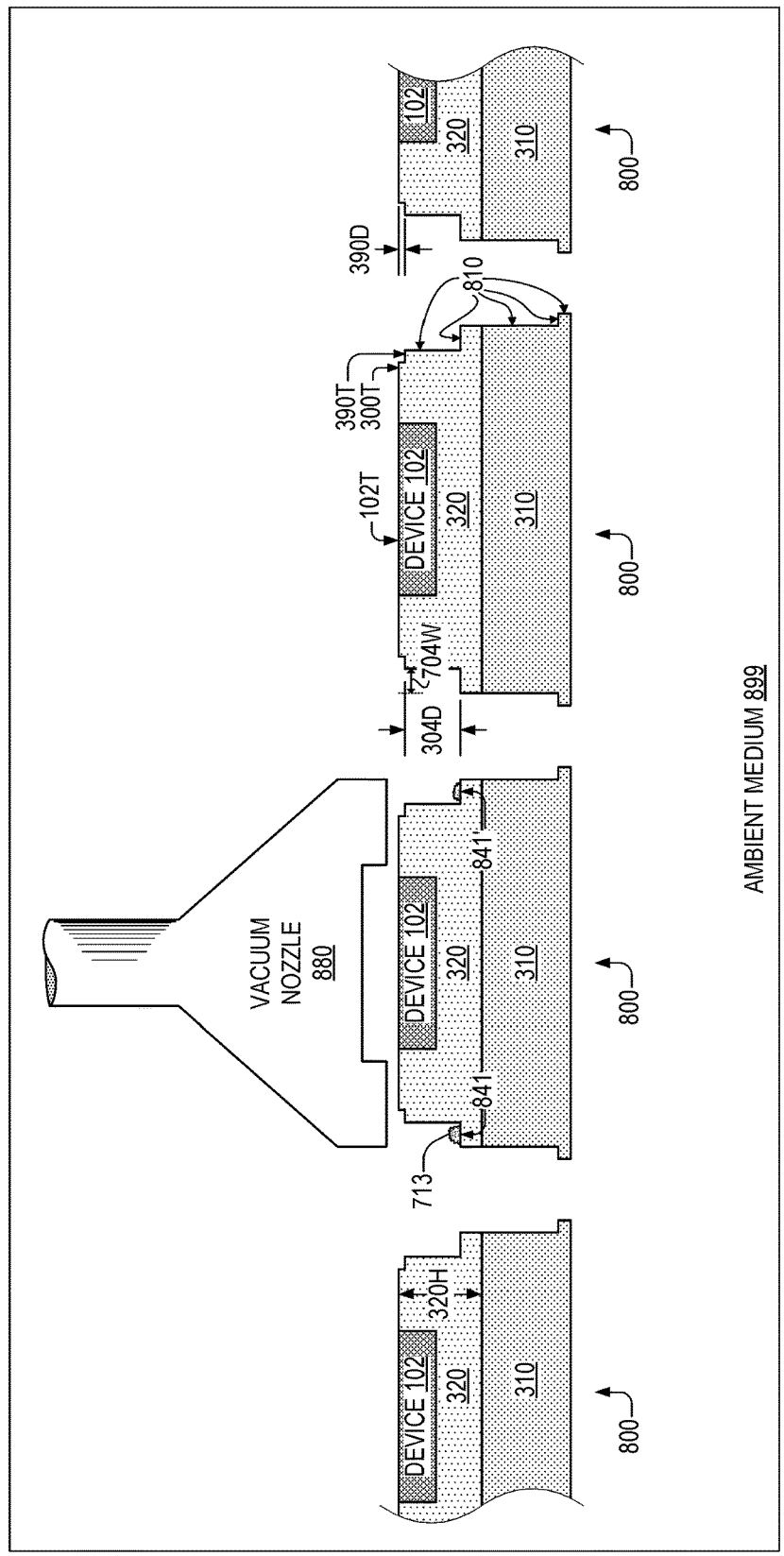
FIG. 8 is a cross-sectional view of a plurality of stepped-sidewall device dies singulated from the trenched device wafer of FIG. 3, in an embodiment.

FIG. 6 is a flowchart illustrating an exemplary method 600 for forming a device die from a device wafer. FIGS. 7-8 are cross-sectional views of a device wafer corresponding to steps of method 600. FIGS. 3-8 are best viewed together with the following description.

In step 610, method 600 forms a trench in a top surface of the device wafer, the trench being located between two adjacent devices of the device wafer, and having a bottom surface located at a first depth beneath the top surface and a first height above a wafer bottom surface. In step 610, the trench may be formed by a dry-etching process that removes portions of a top layer of the device wafer. In an example of step 610, trenches 404 and 404' are formed in trenched device wafer 300. Trenches 404 and 404' may be formed by removing portions of device substrate layer 320 via a dry-etching process, in which case trenches 404 and 404' do not extend into a layer beneath substrate layer 320.

In step 620, method 600 decreases a thickness of the device wafer, between the two adjacent devices, to a thickness less than the first height. In an example of step 620, groove 750 is formed in trenched device wafer 300 along a scribe line 390, which results in a grooved device wafer 700, shown in FIG. 7. Groove 750 has a depth 750D. Step 620 results in a grooved-trench 710 that has a depth 710D equal to the sum of depth 304D and depth 750D. Grooved device wafer 700 has an inter-device thickness 702E that equals depth 710D subtracted from thickness 300E. Groove 750 may extend into carrier 201 without departing from the scope hereof. Groove 750 may be centered about midplane 403. Groove 750 is for example formed by a laser grooving technique known in the art. Step 620 forms debris 713 located on landings 741, and not on top surface 300T.

Groove 750 includes optional landings 741. Landings 741 have a depth 304D and a landing width 741W that is less than or equal to width 304W. FIG. 7 depicts landing 741 as parallel to top surface 300T. Landings 741 and top surface 300T may be non-parallel without departing from the scope hereof.

A groove 750 may include no landings. This occurs, for example, when groove width 750 is formed in a trenched device wafer having either (a) tapered trenches 510 and width 750W equals or exceeds bottom width 510W, or (b) tapered trench 520 and width 750W equals or exceeds bottom width 520W.

Step 620 optionally includes step 622. In step 622, method 600 forms a groove in the trench, in which the groove has a second width, at the first depth, less than a first width of the trench. In an example of step 622, a groove 750 is formed in one of trenches 520, 530, and 540. Groove 750 has a groove width 750W at depth 304D that is less than width 305W. Groove width 750W is for example between 50 µm and 60 µm. Width 305W is the sum of width 750W and twice width 741W. For example, width 305W is between 70 µm and 100 µm. In an embodiment, groove width 750W is between 65 percent and 75 percent of width 305W. Step 620 optionally includes step 624. In step 624, method 600 forms a groove adjacent to the trench so as to remove a sidewall of the trench. In an example of step 624, groove 750 is formed between trenches 404 and 404' (FIG. 4) so as to remove trench sidewalls 404S and 404S'.

In step 630, singulates the device wafer to form a plurality of device dies. Step 630 is performed with a die saw, for example. In an example of step 630, trenched device wafer 300 is singulated such that a portion 202 of carrier 201 is removed between adjacent devices 102, as shown in FIG. 7. Portion 202 has a width 202W that is for example between 25 µm and 40 µm. This example of step 630 results in a plurality of stepped-sidewall device dies 800 singulated from trenched device wafer 300, shown in FIG. 8.

Stepped-sidewall device dies 800 are examples of devices dies singulated from trenched device wafer 300. Each stepped-sidewall device die 800 has a stepped sidewall 810 that includes a landing 841, and optionally a landing 841', that may have debris 713 thereon resulting from step 620. Landings 841 and 841' are analogous to landings 741 of grooved device wafer 700. Landings 841 and 841' each have, for example, width 741W and depth 304D. Device layer 320 has a height 320H shown as exceeding depth 304D. Without departing from the scope hereof, Depth 304D may exceed height 320H such that landings 841 and 841' extend from compound layer 310.

Stepped-sidewall device dies 800 are in an ambient medium 899, such as air or vacuum. Device die 800 has top surface 300T that includes a top surface 102T of device 102. Both top surfaces 300T and 102T directly adjoin ambient medium 899. Stepped sidewall 810 is adjacent to top surface 300T.

Step 640 is optional. In step 640, method 600 sorts the plurality of device dies. In an example of step 640, device dies 800 are sorted with a vacuum nozzle 880.

Combinations of Features:

Features described above as well as those claimed below may be combined in various ways without departing from the scope hereof. The following examples illustrate some possible, non-limiting combinations:

(A1) A trenched device wafer includes a device substrate layer having a top surface; a plurality of devices in the device substrate layer, and a trench in the top surface. The trench extends into the device substrate layer, and is located between a pair of adjacent devices of the plurality of devices.

(A2) In the trenched device wafer denoted by (A1), the top surface may include an indented region corresponding to a scribe line, wherein at least part of the trench is within the indented region.

(A3) A trenched device wafer denoted by one of (A1) and (A2) may further include a second trench located between the pair of adjacent devices and not intersecting the first trench.

(A4) In a trenched device wafer denoted by one of (A1) through (A3), the trench may have a depth, relative to the top surface, between one micrometer and five micrometers.

(A5) In a trenched device wafer denoted by one of (A1) through (A4), the trench may have a width, at the top surface, between ten micrometers and twenty micrometers.

(A6) In a trenched device wafer denoted by one of (A1) through (A5), the trench may be centered between the pair of adjacent devices.

(A7) In a trenched device wafer denoted by one of (A1) through (A6), the trench may have a width between seventy micrometers and one hundred micrometers.

(A8) A trenched device wafer denoted by one of (A1) through (A7), may further include, in which the pair of adjacent devices is denoted by a first image sensor and a second image sensor, a first plurality of conductive traces and a second a first plurality of conductive traces. The first plurality of conductive traces is beneath the device substrate layer and electrically connected to the first image sensor. The second plurality of conductive traces is beneath the device substrate layer and electrically connected to the second image sensor. The trench is above a region between the first plurality of conductive traces and the second plurality of conductive traces, the region being free of any conductive traces.

(B1) A stepped-sidewall device die includes a device substrate layer, a layer portion, and a device formed on the device substrate layer. The device substrate layer has a top surface having a top width. The layer portion has a first width at a first distance beneath the top surface, the first width exceeding the top width.

(B2) The stepped-sidewall device die denoted by (B1) may further include a second layer portion (i) between the first layer portion and the top surface and (ii) having a second width. The first width exceeds both the second width and the top width. The second width exceeds the top width.

(B3) In a stepped-sidewall device die denoted by one of (B1) and (B2), the layer portion may be a portion of the device substrate layer.

(B4) A stepped-sidewall device die denoted by one of (B1) through (B3), may further include a dielectric layer beneath the device substrate layer, having a width greater than or equal to the first width, and including a conductive trace electrically connected to the device.

(B5) In a stepped-sidewall device die denoted by one of (B1) through (B4), the first distance may be between one micrometer and five micrometers.

(B6) In a stepped-sidewall device die denoted by one of (B1) through (B5), the first width may exceed the top width by more than twenty micrometers.

(B7) In a stepped-sidewall device die denoted by one of (B1) through (B6), the first width may exceed the top width by less than forty micrometers.

(B8) In a stepped-sidewall device die denoted by one of (B1) through (B7), the top surface may correspond to a top surface of the stepped-sidewall device die.

(B9) In a stepped-sidewall device die denoted by one of (B1) through (B8), the device may include an image sensor.

(C1) A method for forming a device die from a device wafer includes forming a trench in a top surface of the device wafer between two adjacent devices of the device wafer. The trench has a bottom surface located (a) at a first depth beneath the top surface and (b) at a first height above a wafer bottom surface. The method also includes, after forming the trench, decreasing a thickness of the device wafer, between the two adjacent devices, to a thickness less than the first height.

(C2) In the method denoted by (C1), in which the trench has a first width at the top surface, the step of decreasing may include: forming a groove in the trench, the groove having a second width, at the first depth, less than the first width.

(C3) In the method denoted by one of (C1) and (C2), the step of decreasing may include forming a groove adjacent to the trench so as to remove a sidewall of the trench.

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall therebetween.

What is claimed is:

1. A method for forming a device die from a semiconductor device wafer comprising:
   etching, in a top surface of the semiconductor device wafer between a plurality of pairs of immediately adjacent devices of the semiconductor device wafer, a trench having a first width at the top surface, and having a bottom surface located (a) at a first depth beneath the top surface and (b) at a first height above a wafer bottom surface of the semiconductor device wafer;
   laser-grooving, in the trench, a groove having a second width, at the first depth, less than the first width and extending toward the wafer bottom surface such that the semiconductor device wafer has, between the plurality of pairs of immediately adjacent devices, a non-zero thickness less than the first height; and
   singulating the device wafer to yield the device die.

2. The method of claim 1, the first depth being 2.0±0.5 micrometers.

3. The method of claim 1, the first width being between seventy micrometers and one hundred micrometers.

4. The method of claim 1, the second width being between fifty micrometers and sixty micrometers.

5. The method of claim 1, wherein etching comprises dry-etching the trench.

6. A method for forming a device die from a semiconductor device wafer comprising:
   etching, in a top surface of the semiconductor device wafer, a trench located between a plurality of pairs of immediately adjacent devices of the semiconductor device wafer and having a bottom surface located (a) at a first depth beneath the top surface and (b) at a first height above a wafer bottom surface of the semiconductor device wafer;

laser-grooving a groove adjacent to the trench and extending toward the wafer bottom surface such that a first sidewall of the trench is removed, and between the plurality of pairs of immediately adjacent devices, the semiconductor device wafer has a non-zero thickness less than the first height; and singulating the semiconductor device wafer to yield the device die.

7. The method of claim 6, the plurality of pairs of immediately adjacent devices including a first device and a second device immediately adjacent thereto, the groove having a second width, and further comprising, before the step of laser-grooving:

etching a second trench in the top surface of the semiconductor device wafer, having a finite depth with respect to the top surface, and located between the first device and the second device, the first trench and the second trench being separated by a first width that spans respective widths of the first and second trenches exceeding the second width.

8. The method of claim 6, the first depth being 2.0±0.5 micrometers.

9. The method of claim 8, the first width being between seventy micrometers and one hundred micrometers.

10. The method of claim 8, the second width being between fifty micrometers and sixty micrometers.

11. The method of claim 6, the trench including a second sidewall, opposite the first sidewall, that remains intact in the step of laser-grooving.

12. The method of claim 6, wherein etching comprises dry-etching the trench.

* * * * *